US006785762B2

(12) United States Patent
Takahashi et al.

(10) Patent No.: US 6,785,762 B2
(45) Date of Patent: Aug. 31, 2004

(54) RECORDING/REPRODUCING DEVICE HAVING PLURAL DISK UNITS WHICH ACCESS AN INFORMATION RECORDING MEDIUM INCLUDING A COMPUTER READABLE RECORDING MEDIUM

(75) Inventors: Hiromasa Takahashi, Takasaki (JP); Satoshi Yamato, Maebashi (JP); Yoshifumi Miyaguchi, Takasaki (JP); Yoshimi Iso, Maebashi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 260 days.

(21) Appl. No.: 10/013,498

(22) Filed: Dec. 13, 2001

(65) Prior Publication Data

US 2002/0075738 A1 Jun. 20, 2002

(30) Foreign Application Priority Data

Dec. 18, 2000 (JP) ........................................ 2000-383079

(51) Int. Cl.$^7$ ............................................. G06F 12/00
(52) U.S. Cl. ........................... 711/4; 711/103; 711/165; 713/1; 713/100; 717/168
(58) Field of Search ........................... 711/4, 103, 165; 713/1, 100; 717/168

(56) References Cited

U.S. PATENT DOCUMENTS

| | | | | |
|---|---|---|---|---|
| 4,542,453 A | * | 9/1985 | Patrick et al. | .................. 714/8 |
| 5,481,713 A | * | 1/1996 | Wetmore et al. | ............. 717/170 |
| 5,774,431 A | * | 6/1998 | Bos et al. | ................. 369/30.28 |
| 5,968,141 A | * | 10/1999 | Tsai | ............................. 710/14 |
| 6,170,043 B1 | * | 1/2001 | Hu | .............................. 711/158 |
| 6,253,281 B1 | * | 6/2001 | Hall | ........................... 711/112 |
| 6,393,561 B1 | * | 5/2002 | Hagiwara et al. | ........... 713/100 |
| 6,469,963 B1 | * | 10/2002 | Sawada et al. | ............. 369/47.1 |
| 6,542,981 B1 | * | 4/2003 | Zaidi et al. | ..................... 712/2 |
| 6,621,783 B1 | * | 9/2003 | Murata | ..................... 369/53.31 |

FOREIGN PATENT DOCUMENTS

| | | | | |
|---|---|---|---|---|
| JP | 07-248914 | * | 9/1995 | ............. G06F/9/06 |
| JP | 07-262690 | * | 10/1995 | ........... G11B/20/10 |
| JP | 11-045496 | * | 11/1999 | ........... G11B/19/02 |

OTHER PUBLICATIONS

Translation of Japanese Patent Document 11–045496, pp. 1–14, Feb. 16, 1999.*
Translation of Japanese Patent Document 07–248914, pp. 1–23, Sep. 26, 1995.*
Translation of Japanese Patent Document 07–262690, pp. 1–14, Oct. 13, 1995.*

* cited by examiner

*Primary Examiner*—Matthew Kim
*Assistant Examiner*—Stephen Elmore
(74) *Attorney, Agent, or Firm*—Antonelli, Terry, Stout & Kraus, LLP

(57) ABSTRACT

There is provided an information recording/recording device that can easily modify the respective reproduction control programs and other programs of plural disk drive units simply by mounting an information recording medium in one disk drive unit. One disk drive unit uses predetermined recording information of a mounted information recording medium to rewrite a program stored in a nonvolatile memory of the one disk drive unit, and transfers a program to another disk drive unit over an interface bus to instruct program rewriting. According to the rewriting instruction from the one disk drive unit, the other disk drive unit rewrites a program stored in a nonvolatile memory thereof. If the information recording medium is reproduced in one disk drive unit, program information can be transferred to a different disk drive unit.

11 Claims, 15 Drawing Sheets

▨ ( : NEW MICROCOMPUTER F/W FOR CD-ROM FILE NAME "CDROM_01.BIN" )

▧ ( : NEW MICROCOMPUTER F/W FOR CD-RW FILE NAME "CDRW_01.BIN" )

■ ( : FILE INFORMATION AREA )

RECORDING/REPRODUCING DEVICE HAVING PLURAL DISK UNITS WHICH ACCESS AN INFORMATION RECORDING MEDIUM INCLUDING A COMPUTER READABLE RECORDING MEDIUM

FIELD OF THE INVENTION

The present invention relates to an information recording/reproducing device having plural disk drive units each including a reproduction control program and a CPU (Central Processing Unit) for executing it, and, for example, to techniques applied adaptively to bug corrections or upgrades of reproduction control programs in an information recording/reproducing device capable of reproduction of audio CD (Compact Disk) and dubbing to audio CD-RW (Compact Disk-rewritable) or audio CD-R (Compact Disk-recordable), or an information recording/reproducing device including plural DVD (Digital Video Disk) drive units capable of dubbing.

BACKGROUND OF THE INVENTION

Audio disk (CD, etc.) drives or video disk (DVD, etc.) drives have optical and mechanical components and a control circuit that controls them and performs data processing such as signal processing including filtering. The control circuit comprises a microcomputer and an operation program thereof. The operation program, if a bug is found, must be corrected, and must be upgraded to extend functions. To satisfy such demands, a technique is provided for enabling bug corrections and upgrades without using a host device such as a personal computer. According to this technique, a dedicated disk in which new control programs are recorded is mounted in a disk drive to thereby rewrite program memories such as flash memories incorporated in a microcomputer. This technique is described in Japanese Published Unexamined Patent Application Nos. Hei 7-262690, 11-45496, and 7-248914.

Recently, a law for making it possible to levy music royalties on the media side has been enacted, with the result that it has become possible to provide an information recording/reproducing device capable of reproduction of audio CD and dubbing to audio CD-RW or audio CD-R. The inventor studied the handling of bug corrections and upgrades of reproduction control programs for plural disk drives in audio equipment and video equipment. The study showed that, if a host device such as a personal computer is not used, the prior art dictates remounting an information recording medium in which new control programs are recorded in respective drives to individually perform program rewriting. This would worsen operability such as updating of an access control program and other programs and function extensions by end users immediately before shipment of an information recording/reproducing device. Individually providing a medium in which new control programs are recorded for each of disk drives would be troublesome to information recording/reproducing device manufacturers. The same is also true for optical disk mounting equipment such as car audio systems in which navigation and audio are integrated.

SUMMARY OF THE INVENTION

An object of the present invention is to provide an information recording/reproducing device that permits a reproduction control program or the like in each of plural disk drive units to be subjected to bug corrections and upgraded without using a host device, even if an information recording medium in which new control programs are recorded is not remounted in the respective drives to individually perform program rewriting.

Another object of the present invention is to provide a computer-readable recording medium in which new control programs are recorded and which need not be provided for each of plural disk drive units, when a reproduction control program or the like in each of the disk drive units is subjected to bug corrections and upgraded without using a host device.

The above described objects and other objects, and novel characteristics of the present invention will become apparent from this specification and the accompanying drawings.

Typical ones of inventions disclosed by this application will be described briefly.

[1] In an information recording/reproducing device according to the present invention, programs stored in electrically programmable nonvolatile memories are executed by CPUs, plural disk drive units adapted to enable access to an information recording medium are provided, and the plural disk drive units are connected over an interface bus. To provide for bug corrections and upgrades for the programs stored in the flash memories, one disk drive unit uses predetermined recording information of a mounted information recording medium to rewrite a program stored in a nonvolatile memory of the one disk drive unit, and transfers a program to another disk drive unit to instruct program rewriting. According to the rewriting instruction from the one disk drive unit, the other disk drive unit rewrites a program stored in a nonvolatile memory thereof.

From the foregoing, if the information recording medium is reproduced in one disk drive unit, since program information can be transferred to a different disk drive unit, without having to remount an information recording medium in which new control programs are recorded in the respective disk drive units to individually perform program rewriting, a reproduction control program or the like in each of the plural disk drive units can be subjected to bug corrections and upgraded without using a host device. Therefore, updating of an access control program and other programs and function extensions by end users immediately before shipment of a product can be achieved with simple operations.

When program rewriting is performed in the one and other disk drive units, preferably the one disk drive unit performs program rewriting after program rewriting has been performed in the other disk drive unit. Since access control for the information recording medium may be disabled due to power failure, data errors, or other faults occurring in the course of program rewriting, if program rewriting is performed last in the one disk drive unit that accesses the information recording medium in which new control programs are recorded, access to the information recording medium can be retried however often failures occurred previously, providing safety and reliability for the program rewriting operation.

[2] As a more detailed method of program rewriting for the nonvolatile memories, in terms of program rewriting efficiency, preferably, the one disk drive unit temporarily holds a rewriting program read from an information recording medium in a buffer RAM before writing it to a nonvolatile memory, while the other disk drive unit temporarily holds a rewriting program supplied from the one disk drive unit before writing it to a nonvolatile memory.

The one disk drive unit has the storage area of an interface control program and the storage area of a rewriting control program wherein the interface control program stores a program for the one disk drive unit stored in the mounted information recording medium in one buffer RAM of the one disk drive unit, and transfers a program for another disk drive unit stored in the mounted information recording medium to the other disk drive unit to instruct writing to the other buffer RAM, while the rewriting control program rewrites a program held in a nonvolatile memory of the one disk drive unit to the program held in the one buffer RAM. The other disk drive unit has the storage area of an interface control program and the storage area of a rewriting control program wherein the interface control program, in response to the instruction to write to the other buffer RAM given from the one disk drive unit, stores the program from the one disk drive unit in the other buffer RAM, while the rewriting control program rewrites a program held in a nonvolatile memory of the other disk drive unit to the program held in the other buffer RAM.

The respective nonvolatile memories of the disk drive units may have the storage area of the rewriting control program, and the storage area of the interface control program, in addition to the storage area of an access control program for accessing an information recording medium. The rewriting control program and the interface control program also become rewritable.

In this case, it is desirable that the storage areas of the rewriting control program and the interface control program in the nonvolatile memories can be rewritten mutually independently of the storage areas of the access control program and other programs. Even if a failure occurs in the course of rewriting the access control program and other programs, since the rewriting control program and the interface control program remain intact, the access control program and other programs can be again written to the flash memories from the buffer RAMs, providing safety, reliability, or efficiency for the program rewriting operation.

[3] As a further concrete embodiment of the information recording/reproducing device, for example, assuming that it is capable of reproduction of audio CD and dubbing to audio CD-RW or audio CD-R, it may further have an audio circuit that inputs digital audio data read from an information recording medium mounted in the respective disk drive units and can reproduce it to a sound signal, wherein at least one of the disk drive units inputs digital audio data read from an information recording medium mounted in another disk drive unit over the interface bus and can write it to an information recording medium mounted in the one disk drive unit.

Assuming that an information recording/reproducing device includes plural DVDs (Digital Video Disks) so as to be capable of dubbing, it may further have a reproducing circuit that inputs and can reproduce digital data read from an information recording medium mounted in the respective disk drive units, wherein at least one of the disk drive units may input digital data read from an information recording medium mounted in another disk drive unit over the interface bus to write it to an information recording medium mounted in the one disk drive unit.

The CPU and the nonvolatile memory may be constituted by a microcomputer formed on one semiconductor chip.

[4] A computer-readable recording medium according to the present invention is a recording medium such as CD-ROM in which a first access control program executed by a first CPU for instructing a first disk drive unit to access an information recording medium, a second access control program executed by a second CPU for instructing a second disk drive unit to access an information recording medium, and information for identifying the first access control program and the second access control program are recorded in a computer-readable form.

When a reproduction control program or the like in each of the plural disk drive units is subjected to bug corrections and upgraded without using a host device, a computer-readable recording medium in which a new control program is recorded need not be provided for each of the disk drive units. The disk drive units determine which access control program should be rewritten in which disk drive, based on the identification information.

Assuming that the information recording/reproducing device is capable of reproduction of audio CD and dubbing to audio CD-RW, the recording medium is a computer-readable CD-ROM medium in which a first access control program for instructing a CD-ROM disk drive unit having a CPU to access CD-ROM media, a second access control program for instructing a CD-RW disk drive unit having a CPU to access CD-RW media, and the file identification information of the first access control program and the second access control program are recorded so as to be accessible in the CD-ROM disk drive unit or CD-RW disk drive unit.

DETAILED DESCRIPTION OF THE PREFERRED EMBODIMENTS

<<Outline of Information Recording/Reproducing Device>>

Figure 1:
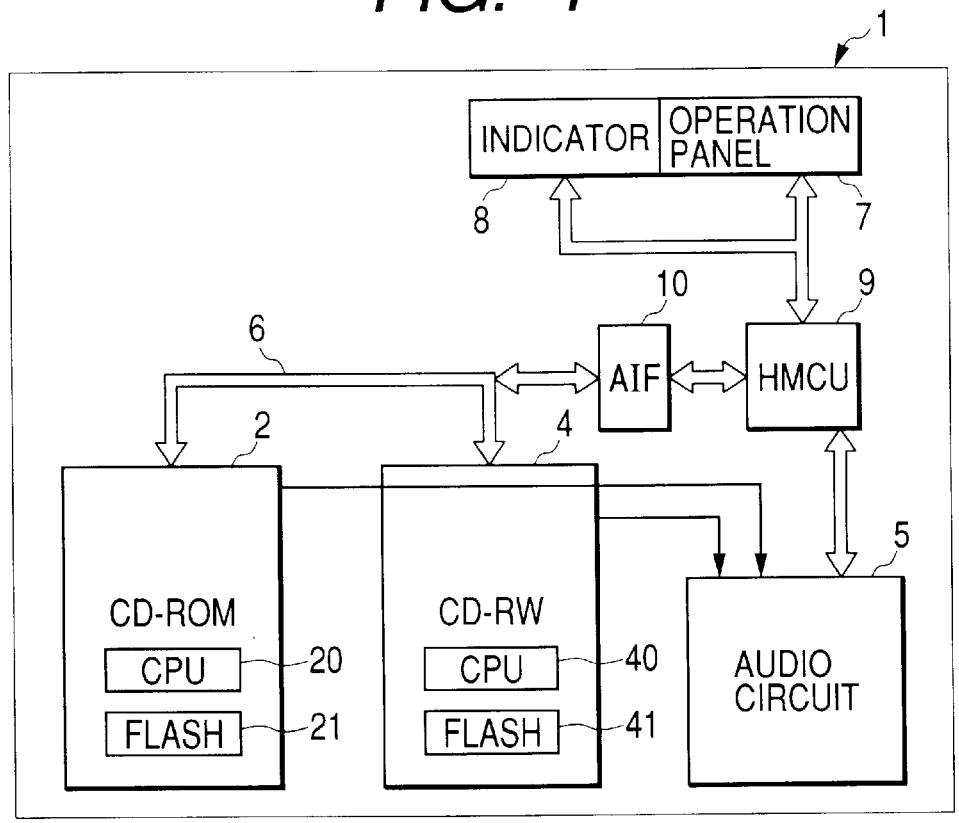
FIG. 1 is a block diagram showing an example of an information recording/reproducing device according to the present invention.

FIG. 1 shows an example of an information recording/reproducing device according to the present invention. An information recording/reproducing device 1 shown in the drawing, although not particularly limited, which has a DC-ROM disk drive unit 2 and a CD-RW disk drive unit 4 as disk drive units, is positioned as an audio device capable of audio CD reproduction and dubbing to audio CD-RW. The disk drive units 2 and 4 each, although not particularly limited, are those used singly as peripheral devices of personal computers (PC) and the like and can access CD-ROM data; herein, they are primarily used in a form that supplies audio data subjected to digital signal processing to an audio circuit 5 and reproduces it. The disk drive units for PC use are used because they have relatively high performance and cost merits. The ability of the disk drive units 2 and 4 to process digital data, which is non-audio data, is used to rewrite programs serving as firmware (described later) of the disk drive units 2 and 4 (system modification processing).

The disk drive units 2 and 4 comply with ATAPI (ATAttachment Packet Interface), SCSI (Small Computer System Interface), or other interface specifications, and, for example, have ATAPI interface circuits and are connected with each other over an ATAPI interface bus 6 so that command exchange and data sending and receiving can be performed between them.

The operation panel 7 has buttons for recording, volume, side balance, and other uses for each of the disk drive units 2 and 4. The statuses of operations by the operation panel 7 are displayed in the indicator 8. The information recording/reproducing device 1 has a host microcomputer (HMCU) 9. The host microcomputer (HMCU) 9 inputs operation signals of the operation panel 7 and outputs instructions presented by them to the audio circuit 5 and the indicator 8. Further, the host microcomputer 9 outputs read, write, jump, and other instructions for the disk drive units 2 and 4 from the operation panel 7 to an ATAPI interface circuit (AIF) 10 so that the instructions are presented as commands from the ATAPI interface circuit 10 to the disk drive units 2 and 4 over the ATAPI interface bus 6.

The CD-ROM disk drive unit 2 executes a program stored in an electrically erasable nonvolatile memory such as, e.g., a flash memory (FLASH) 21 by a CPU 20 to enable read accesses to audio CD and CD-ROM disks. The CD-RW disk drive unit 4 executes a program stored in an electrically erasable nonvolatile memory such as, e.g., a flash memory (FLASH) 41 by a CPU 40 to enable read accesses to audio CD, audio CD-RW, and CD-ROM disks, and write accesses to audio CD-RW disks. To provide for bug corrections and upgrades for the programs stored in the flash memories 21 and 41, one disk drive unit, for example, the CD-ROM disk drive unit 2 uses predetermined recording information of a CD-ROM system modification disk mounted for upgrades or system modifications to rewrite the program stored in the flash memory 21 of the CD-ROM disk drive unit 2, and can transfer a program to the other CD-RW disk drive unit 4 to instruct program rewriting. According to the rewriting instruction from the CD-ROM disk drive unit 2, the CD-RW disk drive unit 4 can rewrite the program stored in the flash memory 41 thereof.

Figure 2:
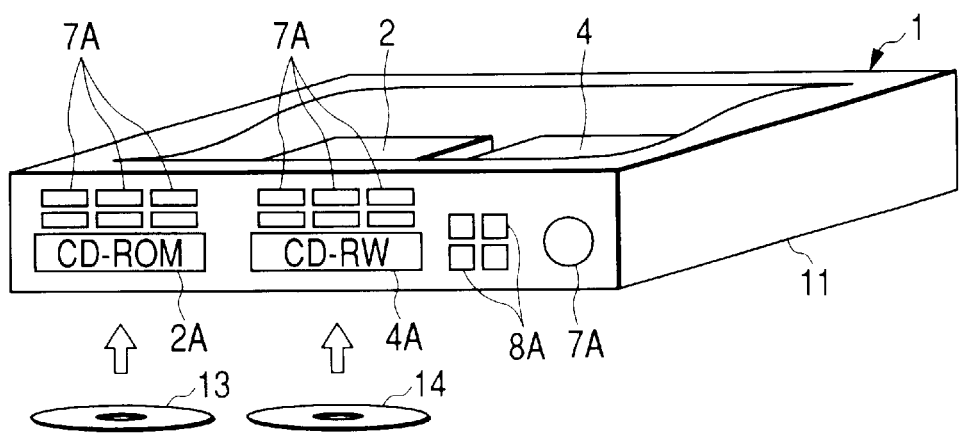
FIG. 2 is an external perspective view of the information recording/reproducing device of FIG. 1 that is partially cut out.

FIG. 2 shows an external view of the information recording/reproducing device 1 partially cut out. The components in FIG. 1 are housed in a cabinet 11, and disk mounting slots 2A and 4A of the disk drive units 2 and 4, part 7A of the operation panel 7, and part 8A of the indicator 8 are exposed to the outside. A-CD-ROM disk 13 or the like can be mounted in the disk mounting slot 2A, and a CD-RW disk 14 or the like can be mounted in the disk mounting slot 4A.

Figure 3:
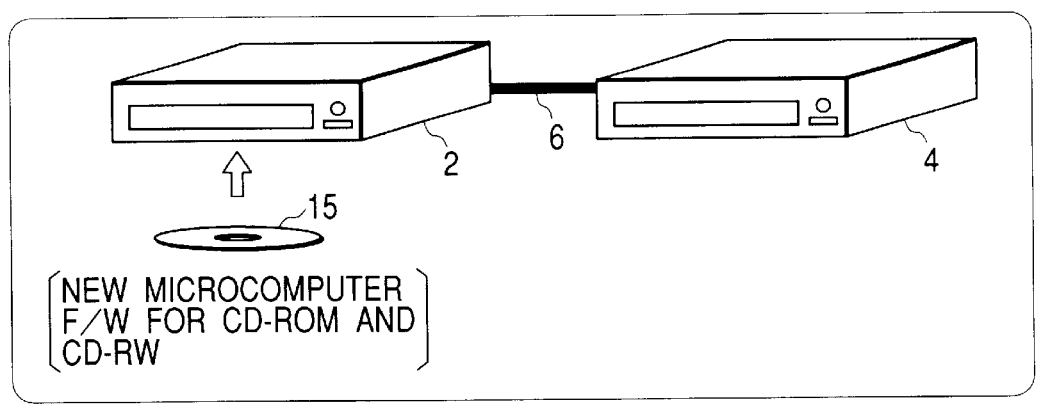
FIG. 3 schematically illustrates a relationship between a pair of a disk drive unit and a system modification disk in the information recording/reproducing device of FIG. 1.
Figure 4:
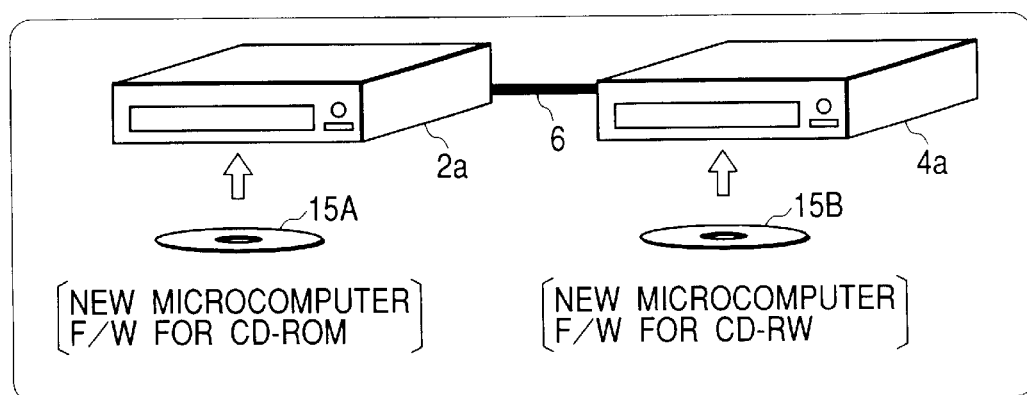
FIG. 4 schematically illustrates a relationship between a pair of a disk drive unit and a system modification disk in a conventional information recording/reproducing device.

With the above described configuration of the information recording/reproducing device 1, as shown in FIG. 3, if a system modification disk 15 is reproduced in one disk drive unit 2, program information can be transferred to the other disk drive unit 4 to instruct rewriting. FIG. 3 shows the disk drive units 2 and 4 removed from the information recording/reproducing device 1. This does not require processing as shown in FIG. 4 that system modification disks 15A and 15B in which an upgrade program or the like is stored should be respectively mounted in disk drive units 2a and 4a to individually perform program rewriting. Therefore, the information recording/reproducing device 1 can make bug corrections and upgrades of reproduction control programs in the disk drive units 2 and 4 without using a host device, and enables the rewriting of an access control program or the like and function extension by end users with simple operations immediately before product shipment.

<<Details of Disk Drive Unit>>

Figure 5:
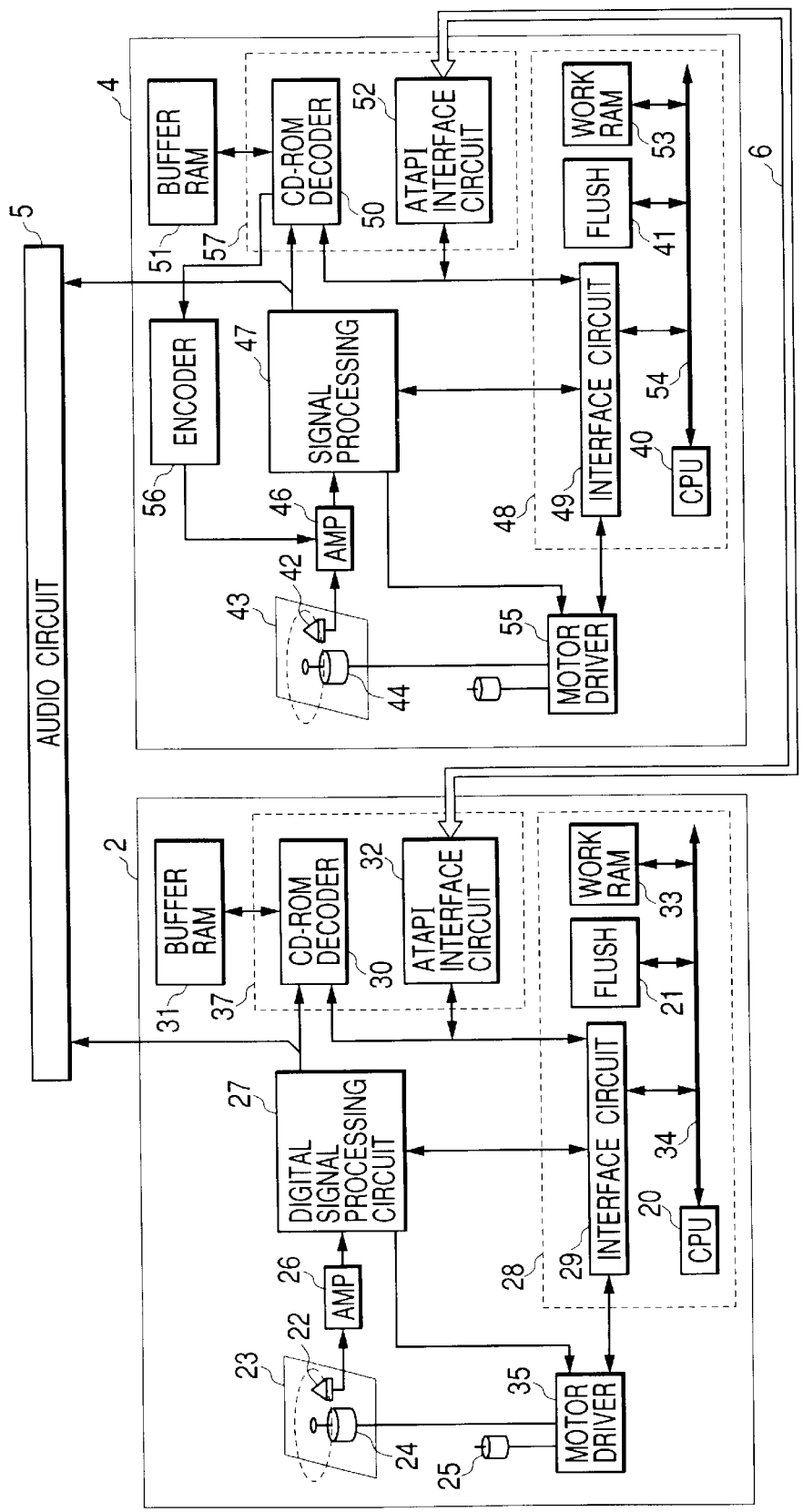
FIG. 5 is a block diagram showing details of a CD-ROM disk drive unit and a CD-RW disk drive unit.

FIG. 5 shows details of a CD-ROM disk drive unit and a CD-RW disk drive unit.

The CD-ROM disk drive unit 2 rotatably supports an optical disk such as CD-ROM disk, audio CD, or audio CD-RW disk, and has a mechanical part 23 for supporting a pickup 22 to enable focusing and sled movement for an optical disk. A CD-ROM disk is rotated by a disk motor 24, sled movement is made by a sled motor 25, and focusing is performed by an electromagnetic actuator not shown.

The pickup 22 irradiates laser light to an optical disk rotated, receives its reflected light in a light receiving part comprising photodiodes to perform photoelectric conversion, and thereby reads information recorded on the optical disk.

A signal (high-frequency signal) read from the pickup 22 is amplified by a read amplifier (AMP) 26 and supplied to a digital signal processing circuit 27. The digital signal processing circuit 27 binarizes the input signal to a digital signal by its digital filter function. The digital signal processing circuit 27 further performs speed control processing, EFM demodulation processing, and error correction processing, based on the digital signal.

In the speed control processing, a rotation speed of the optical disk is detected and the disk motor 24 is controlled so as to rotate the optical disk at a predetermined speed. In the EFM demodulation processing, based on a synchronous signal detected in the speed control processing, a read signal as an EFM modulation signal is demodulated. The demodulated signal is subjected to error correction.

Subcodes contained in each frame of the demodulated signal are supplied to the microcomputer 28. The microcomputer 28 assembles the inputted subcodes, recognizes time information, index information, etc., and supplies control information for controlling the disk motor 24 and the sled motor 25 to the digital signal processing circuit 27. File information and disk format information recorded in an inner circumferential area of the optical disk are also inputted to the microcomputer to indicate the format of the disk and file locations on the disk.

Where the optical disk is an audio CD disk or audio CD-RW disk, a data signal contained in each frame of a demodulated signal is audio information. The audio information is supplied from the digital signal processing circuit 27 to the audio circuit 5, where it is converted to an analog signal and amplified.

The signal demodulated in the digital signal processing circuit 27 is also supplied to a CD-ROM decoder 30. To the CD-ROM decoder 30, a buffer RAM 31 is connected. The CD-ROM decoder 30 includes a buffer RAM controller, an error correcting circuit, and a synchronous signal detection/deinterleave circuit, which are not shown. The buffer RAM controller is a memory controller for the buffer RAM 31. The synchronous signal detection/deinterleave circuit detects a synchronous signal from input and performs deinterleave processing. The error correcting circuit performs error correction for the input data by additional error correcting codes such as ECC. The buffer RAM controller successively holds data deinterleaved and subjected to error correction, or input data exempted from deinterleave processing and error correction processing in the buffer RAM 31. Data held in the buffer RAM 31 can be outputted from an ATAPI interface circuit 32 to the ATAPI interface bus 6 according to a predetermined format.

The deinterleave processing and the error correction processing in the CD-ROM decoder 30 are performed in the case where the optical disk is a CD-ROM disk or CD-RW disk for data. In short, they are performed in the case where the optical disk is the system modification disk 15 storing programs for upgrades or function extensions. If the optical disk is audio CD disk or audio CD-RW disk, the deinterleave processing and the error correction processing are not performed. In audio data dubbing from the CD-ROM disk drive unit 2 to the CD-RW disk drive unit 4, the CD-ROM decoder 30 only temporarily stores the audio data in the buffer RAM 31 by the buffer RAM controller.

The ATAPI interface circuit 32 includes a command buffer and a protocol sequence control circuit, which are not shown. The protocol sequence control circuit provides interface control for data and commands that comply with the ATAPI interface specification. An ATAPI interface is an interface specification for making CD-ROM drives and the like controllable through an existing IDE interface controller used for an interface with hard disk drives and the like. The ATAPI interface specification enables commands (hereinafter simply referred to as ATAPI commands) complying with the SCSI2 specification to be inputted and outputted as packets. In other words, the protocol sequence control circuit, according to commands given from the microcomputer 28, outputs data and commands to the interface bus 6 in compliance with the ATAPI interface specification. Upon input of a command and data from the interface bus 6, the protocol sequence control circuit requests the microcomputer 28 to process the command and data through an interrupt or other means. ATAPI interface specifications include "ATA Packet Interface for CD-ROM Revision 1.2" developed by a company belonging to the external storage industry group SSF (Small Form Factor) committee.

The microcomputer 28 includes CPU 20, flash memory 21, work RAM 33, interface circuit 29, etc. on one semiconductor board such as a single-crystal silicon in such a form that the circuit modules share an internal bus 34 although not particularly limited. The flash memory 21 as a semiconductor memory that is electrically erasable and programmable is used as a memory for storing an operating program of the CPU 20 and constant data. According to the operating program, the CPU 20 controls a motor driver 35, the digital signal processing circuit 27, the CD-ROM decoder 30, the ATAPI interface circuit 32, and the like. The work RAM 33 is used as a work area or the like of the CPU 20.

The flash memory 21 is configured so that its storage area can be collectively erased in blocks (memory blocks) and data can be rewritten in blocks. Since such a flash memory is already known, a detailed description of it is omitted. Its memory cell transistor comprises a field-effect transistor of insulation gate type of two-layer gate structure that has a floating gate and a control gate. A write of information to the memory cell transistor can be achieved, for example, by applying a high voltage to a control gate and a drain and injecting electrons from the drain to the floating gate. As a result of the write operation, the memory cell transistor has a threshold voltage with respect to the control gate that is higher than that of a memory cell transistor of erase state that performed no write operation. On the other hand, an erase operation is achieved, for example, by applying a high voltage to the source and removing electrons from the floating gate to the source, with the result that the memory cell transistor is reduced in threshold voltage with respect to the control gate. With respect to a word line selection level afforded to the control gate from a word line, a threshold voltage during writing is made higher, while a threshold voltage during erasing is made lower. Various methods are presently available for control of erase and write operations on memory cell transistors; some collectively erase memory cell transistors whose source is connected in common, and others collectively erase memory cell transistors whose control gate is connected in common. These methods enable collective erasure in blocks. Blocks to be erased can be specified by setting control data for an erase block specification register. Operations on a flash memory such as erase, erase and verify, write, write and verify, and read can be specified by setting control information in a mode register of the flash memory. The settings are performed by the CPU 20 according to its operation programs.

The internal bus 34 is a generic name for buses for addresses, data, and control signals. A data bus and an address bus contained in the internal bus 34 are connected to the CD-ROM decoder 30 and the ATAPI interface circuit 32 via the interface circuit 29. According to the operation programs, the CPU 20 accesses a command buffer of the ATAPI interface circuit 32, sets control information in the buffer RAM controller of the CD-ROM decoder 30, and accesses the buffer RAM 31 via the buffer RAM controller or directly. Commands specifying reproduction and reproduction tracks to the CD-ROM disk drive unit 2 are sent to the ATAPI interface circuit 32 from the operation panel 7 via the ATAPI bus 6. To commands, the CPU 20 responds through an interrupt or the like as described previously.

In FIG. 5, the CD-RW disk drive unit 4, in addition to a basic configuration of the CD-ROM disk drive unit 2, is provided with hardware and software for enabling the writing of audio data to an audio CD-RW disk as an optical disk. An encoder 56 is provided to write audio data. For dubbing of audio information, the audio information supplied from the CD-ROM disk drive unit 2 via the ATAPI bus 6 is stored in the buffer RAM 51 via the buffer RAM controller of the CD-ROM decoder 50. The stored audio data is sequentially sent to the encoder 56 for conversion to an audio CD format, is supplied to a read-write amplifier 46 for amplification, and is written to a CD-RW disk via the pickup 42. A program for controlling such dubbing is stored in the flash memory 41. The CD-RW disk drive unit 4 has the same configuration as the CD-ROM disk drive unit 2 in other portions, and as a whole includes pickup 42, mechanism part 43, disk motor 44, sled motor 45, read-write amplifier (AMP) 46, digital signal processing circuit 47, microcomputer 48, interface circuit 49, CD-ROM decoder 50, buffer RAM 51, ATAPI interface circuit 52, work RAM 53, internal bus 54, motor driver 55, and encoder 56.

<<Program Space>>

Figure 6:
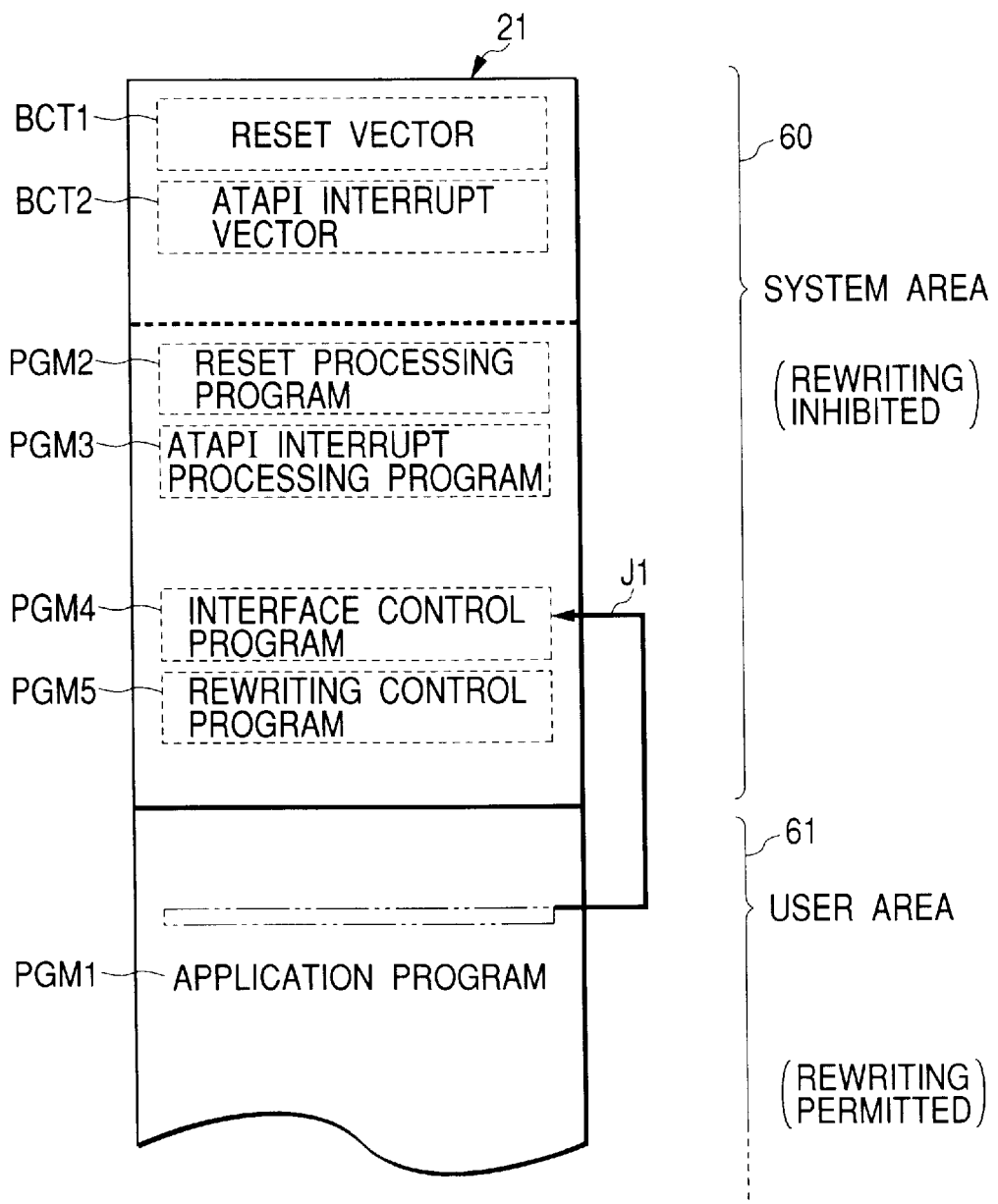
FIG. 6 is a memory map diagram on operation programs of a CPU incorporated in a CD-ROM disk drive unit.

FIG. 6 shows operation programs of the CPU 20. The flash memory 21 to store the operation programs of the CPU 20 includes a system area 60 and a user area 61 as a program storage area. The user area 61 is a program area to store an application program PGM1 for reproducing audio data from an audio CD and transferring audio data to be dubbed to the CD-RW disk drive unit 4 via the ATAPI bus 6. The user area 61 is open to users.

The system area 60 is a program area not open to users and includes an area to store vectors typified by reset vector BCT1 and ATAPI interrupt vector BCT2, an area to store a reset processing program PGM2 and an ATAPI interrupt control program PGM3 referenced by the vectors, and an area to store an interface control program PGM4 and a rewriting control program PGM5.

The reset processing program PRG1 is referenced by the reset vector BCT1. That is, when power-on reset, or hardware or software reset is specified, the CPU 20 reads the reset vector BCT1, branches reset processing to the start address of the reset processing program PRG1 specified by the vector, and initializes the CD-ROM disk drive unit 2 and gets it waiting for reproduction and other ATAPI commands.

The reset processing program PRG2 is referenced by the ATAPI interrupt vector BCT2. That is, in the ATAPI protocol, a series of information items supplied to the ATAPI interface circuit 32 are preceded by a command. The command is inputted to a command buffer. Upon input of the command to the command buffer, the ATAPI interface circuit 32 indicates the event to the CPU 20 by an interrupt signal. Upon receipt of the ATAPI interrupt, the CPU 20 references the ATAPI interrupt vector BCT2 and branches the processing to the ATAPI interrupt processing program PRG2, gets and decodes the command, and transfers to appropriate processing according to the decoding results.

When performing disk access control according to an application program, the CPU 20 branches processing to the interface control program PGM4 upon detecting that the disk is the system modification disk 15 (J1).

The interface control program PGM4 stores a program for the CD-ROM disk drive unit 2, one of the two disk drive units, stored in the system modification disk 15, in the buffer RAM 31 of the disk drive unit 2, transfers a program for the CD-RW disk drive unit 4, the other of the two disk drive units, stored in the mounted system modification disk 15, to the disk drive unit 4, and controls writing to the buffer RAM 51. Instructions to the CD-RW disk drive unit 4 are made using ATAPI commands. The ATAPI commands used at this time are command codes not reserved in the ATAPI interface specification, that is, vendor unique commands. The rewriting control program PGMS performs control so as to rewrite the program held in the flash memory 21 of the CD-ROM disk drive unit 2 to the program held in the buffer RAM 31. The flash memory 21 has plural memory blocks which are the unit of collective erasure. At this time, the system area 60 and the user area 61 are allocated to memory blocks different from each other. Although no special limitations are provided, the rewriting control program PGM5 makes a write only to the user area 61.

Figure 7:
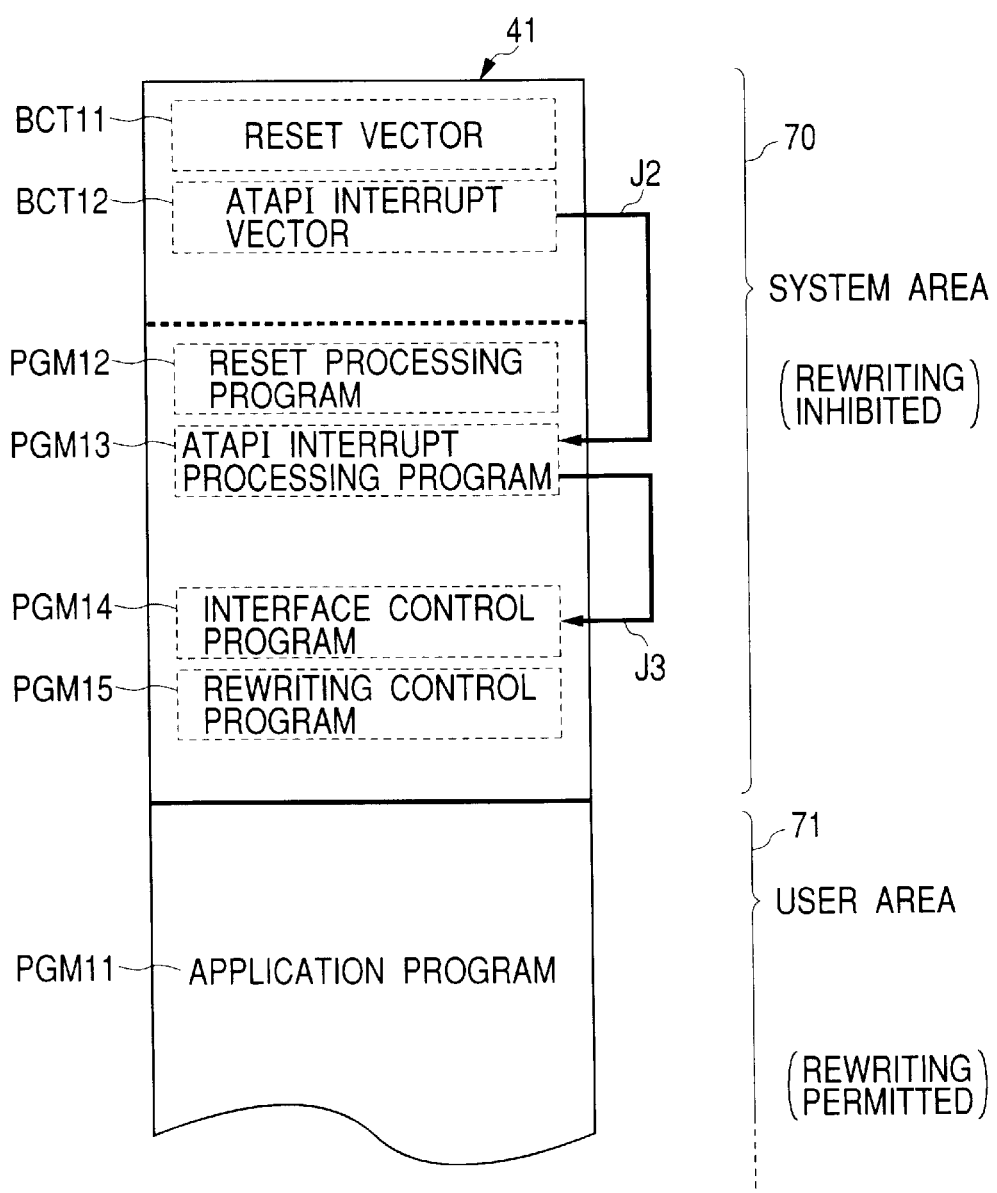
FIG. 7 is a memory map diagram on operation programs of a CPU incorporated in a CD-RW disk drive unit.

FIG. 7 shows operation programs of the CPU 40. The flash memory 41 to store the operation programs of the CPU 40 includes a system area 70 and a user area 71 as a program storage area. The user area 71 is a program area to store an application program PGM11 for reproducing audio data from an audio CD and writing audio data supplied from the CD-ROM disk drive unit 2 via the ATAPI bus 6 for the purpose of dubbing to a CD-RW disk. The user area 71 is open to users.

The system area 70 is a program area not open to users and includes an area to store vectors typified by reset vector BCT11 and ATAPI interrupt vector BCT12, an area to store a reset processing program PGM12 and an ATAPI interrupt control program PGM13 referenced by the vectors, and an area to store an interface control program PGM14 and an rewriting control program PGM15 executed in response to instructions from the CD-ROM disk drive unit 2.

The reset processing program PRG11 is referenced by the reset vector BCT11. That is, when power-on reset, or hardware or software reset is specified, the CPU 40 reads the reset vector BCT11, branches reset processing to the start address of the reset processing program PRG11 specified by the vector, and initializes the CD-RW disk drive unit 4 and gets it waiting for reproduction, write, and other ATAPI commands.

The reset processing program PRG12 is referenced by the ATAPI interrupt vector BCT12. That is, upon input of an ATAPI command to a command buffer, the ATAPI interface circuit 52 indicates the event to the CPU 40 by an interrupt signal. Upon receipt of the ATAPI interrupt, the CPU 40 references the ATAPI interrupt vector BCT12 and branches the processing to the ATAPI interrupt processing program PRG12, gets and decodes the command, and transfers to appropriate processing according to the decoding results.

A system modification instruction given from the CD-ROM disk drive unit 2 is given by an ATAPI command via the ATAPI bus 6. Upon receipt of the ATAPI interrupt, the CPU 40 references the ATAPI interrupt vector BCT12 and branches the processing to the ATAPI interrupt processing program PRG13 (J2), gets and decodes a vendor unique command for specifying system modification, and in response to the system modification instruction, branches processing to the execution of the interface control program PGM14 and the rewriting control program PGM25 (J3).

The interface control program PGM14 responds to the system modification instruction given by the ATAPI vendor unique command from the CD-ROM disk drive unit 2 and controls processing that stores the program supplied from the CD-ROM disk drive unit 2 via the ATAPI bus 6 in the buffer RAM 51. The rewriting control program PGM 15 controls processing that rewrites the application program held in the flash memory 41 to the program held in the buffer RAM 51.

<<Modification Disk>>

Figure 8:
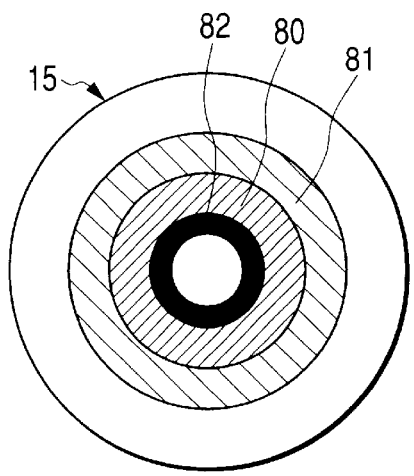
FIG. 8 is a plan view showing a system modification disk as an example of a computer-readable recording medium according to the present invention.

FIG. 8 shows the system modification disk. On the system modification disk 15 shown in the drawing, although it is not particularly limited, a modification program file (file name: CDROM_01.BIN) 80 for the CD-ROM disk drive unit 2, a modification program file (filename: CDRW_01.BIN) 81 for the CD-RW disk drive unit 4, and file information 82 such as the file names of the program files and information (address information) about of tracks and sectors in which the files are recorded are recorded so as to be readable to computers. The modification program file 80 corresponds to the application program PGM1 for the CD-ROM disk drive unit 2. The modification program file 81 corresponds to the application program PGM11 for the CD-ROM disk drive unit 4.

Figure 9:
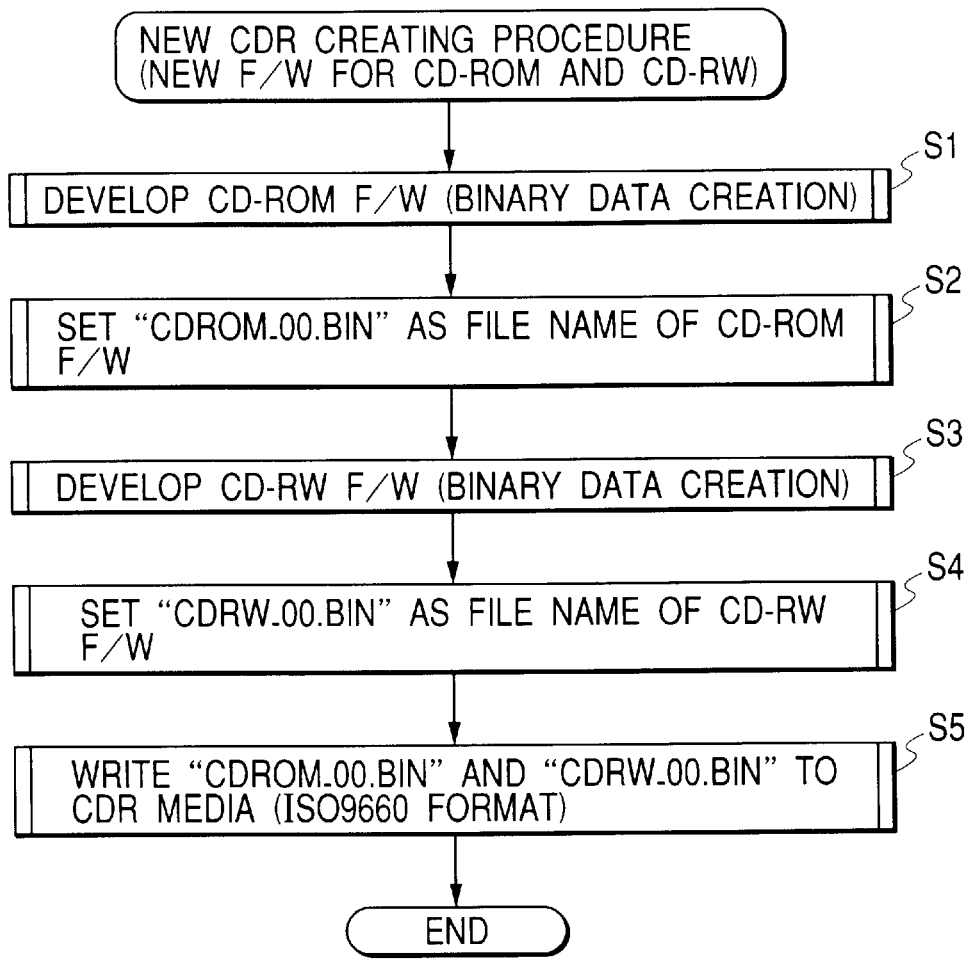
FIG. 9 is a flowchart showing a procedure for creating a system modification disk.

FIG. 9 shows a procedure for creating the system modification disk 15. First, a firmware (F/W) of the CPU 20, which is an application program for the disk drive unit 2, is created as binary data (S1). A file name, e.g., "CDROM__00.BIN" is assigned to the created application program (S2). Next, a firmware (F/W) of the CPU 40, which is an application program for the disk drive unit 4, is created as binary data (S3). A file name, e.g., "CDRW__00.BIN" is assigned to the created application program (S4). A CD-ROM disk on which the programs, file names, etc. are recorded in, e.g., the ISO9660 format is created (S5).

Figure 10:
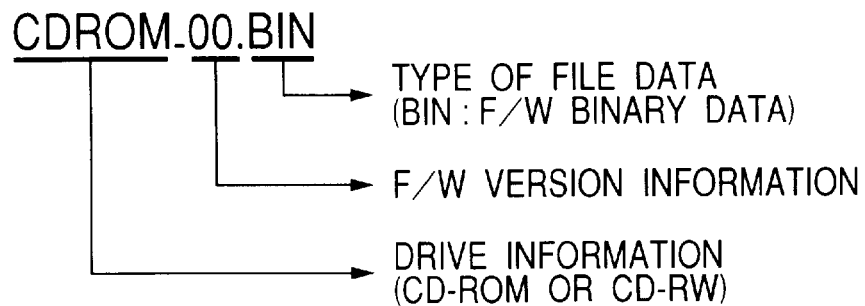
FIG. 10 illustrates a definition of the file name of a program recorded in a system modification disk.

FIG. 10 shows a definition of the file name of a program recorded in the system modification disk. Herein, the file name indicates drive information (CDROM), version information (00), and a file data type (BIN).

<Program Rewriting>

Figure 11:
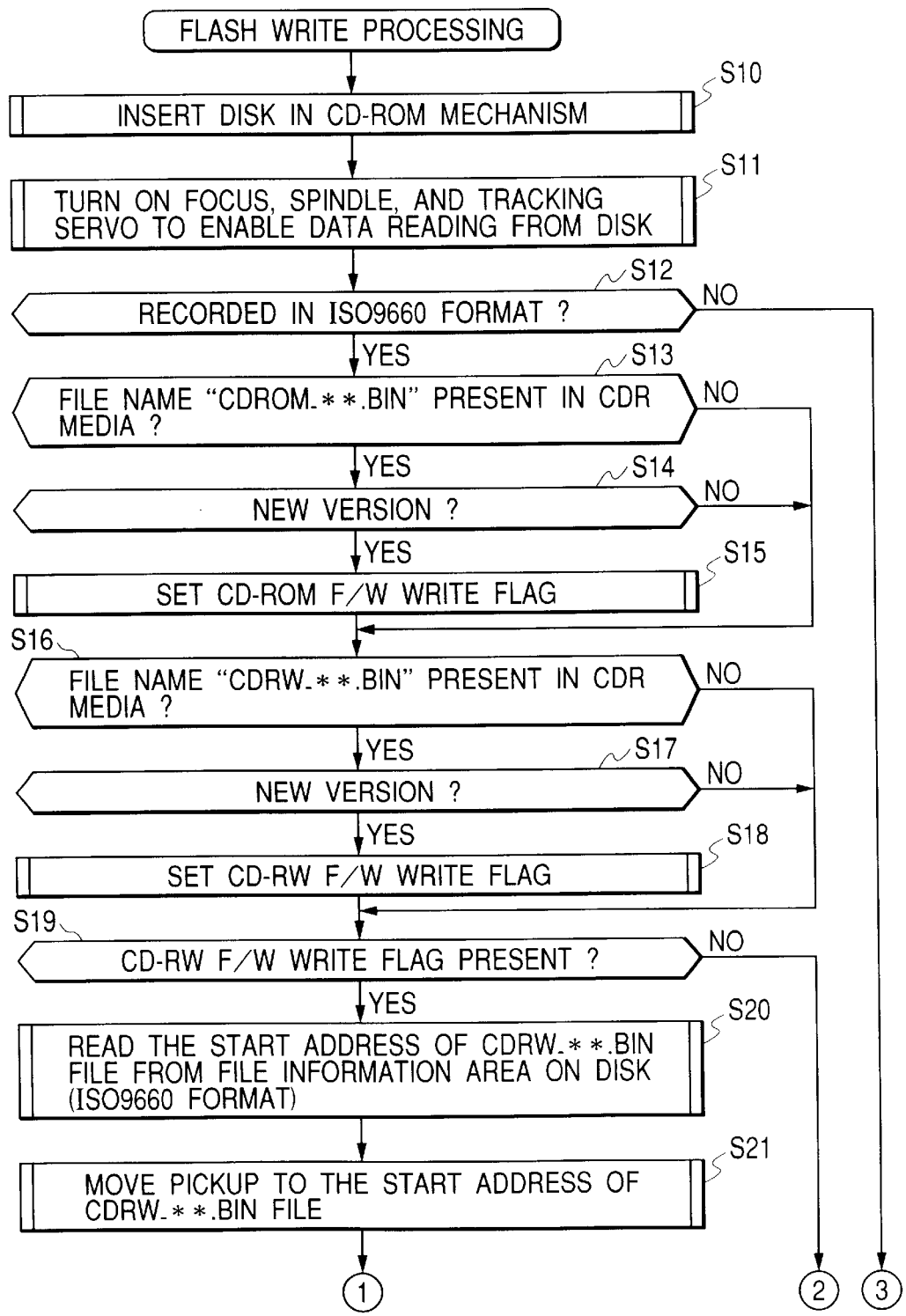
FIG. 11 is a flowchart showing a program rewriting procedure by use of a system modification disk in conjunction with FIG. 12.
Figure 12:
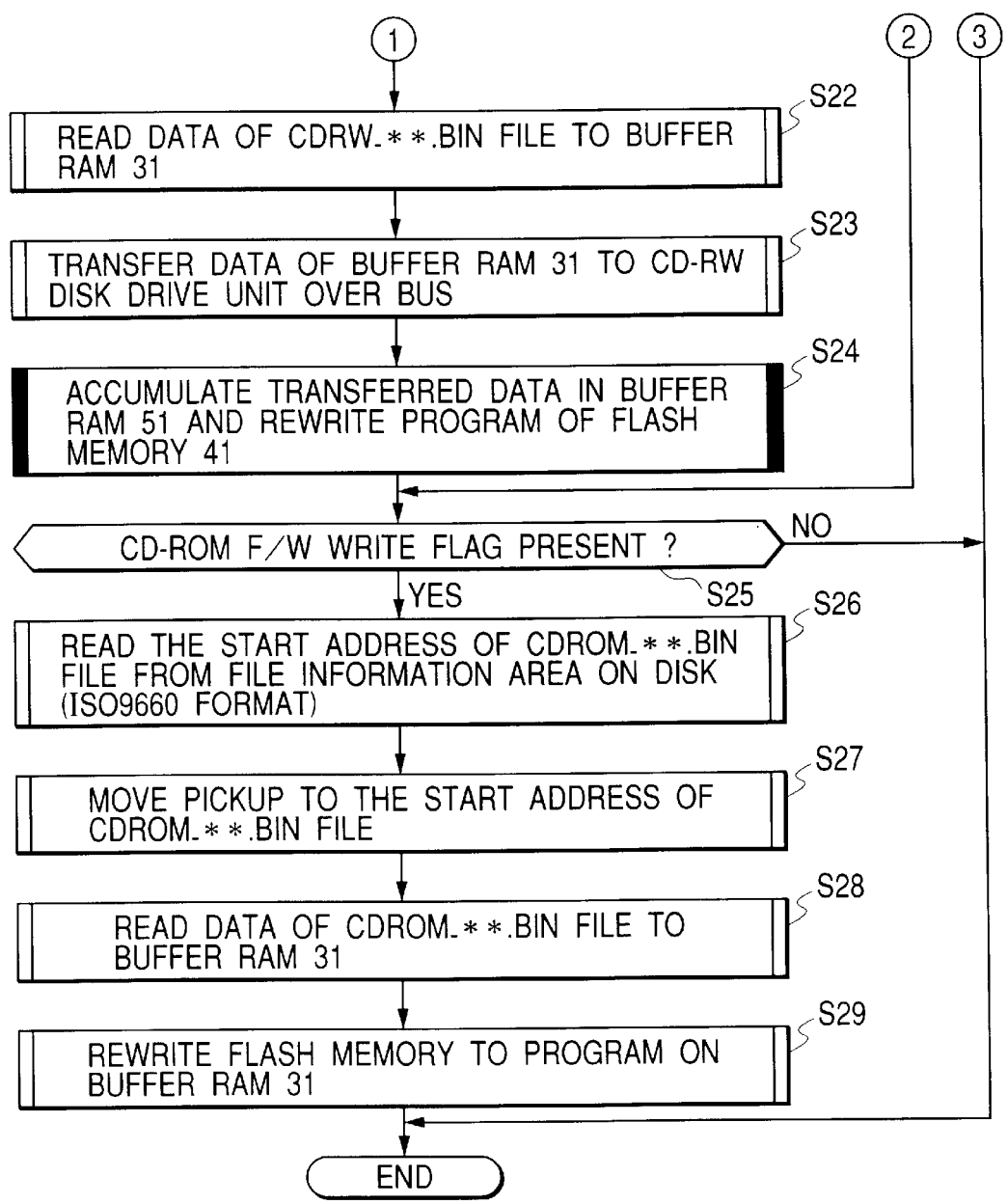
FIG. 12 is a flowchart showing a program rewriting procedure by use of a system modification disk in conjunction with FIG. 11.

FIGS. 11 and 12 show by a flowchart a program rewriting procedure by use of the system modification disk 15. FIGS. 13 to 18 schematically show major points of processing by the flowchart of FIGS. 11 and 12.

Figure 13:
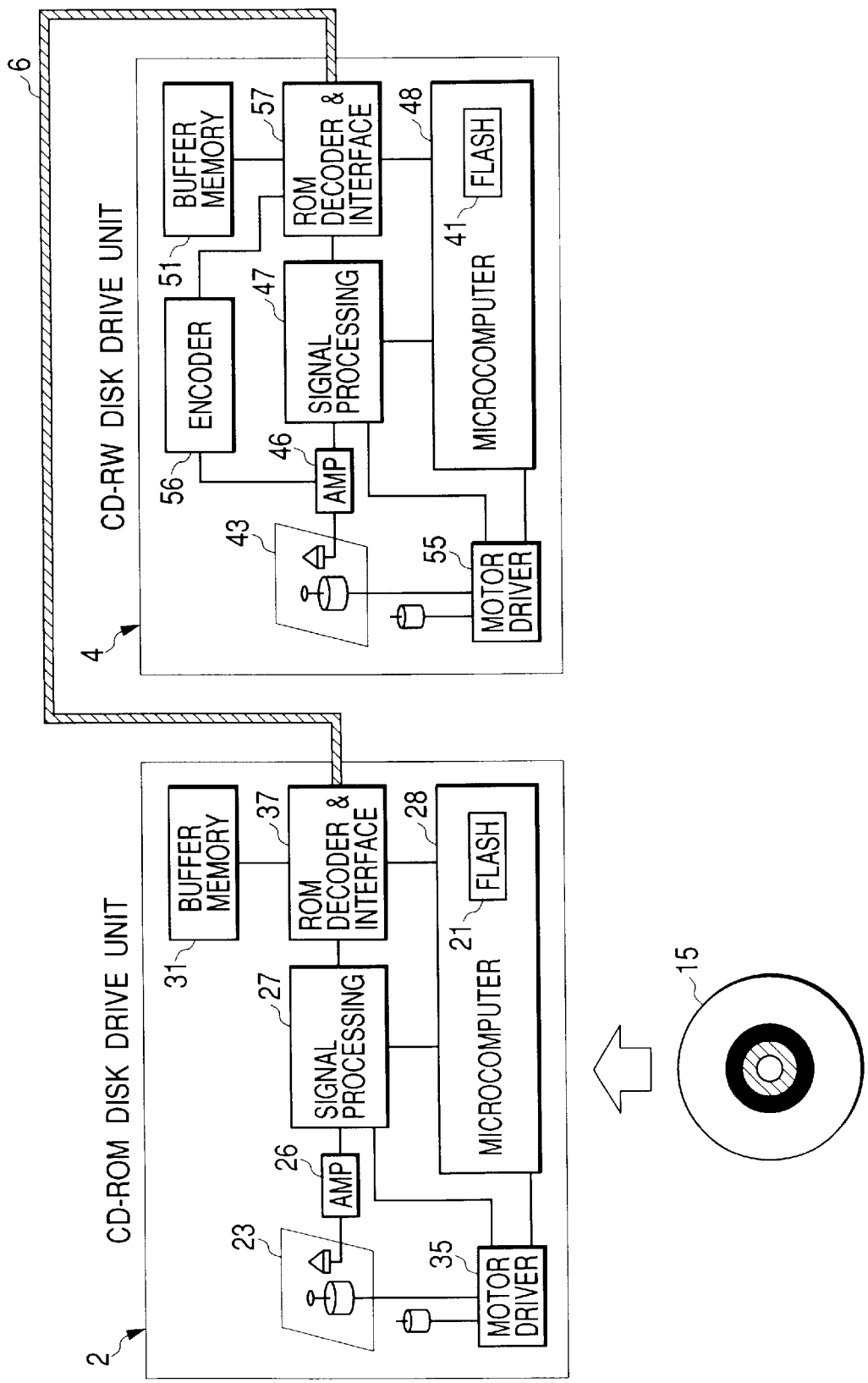
FIG. 13 is a diagram for explaining the operation when a system modification disk is mounted in the CD-ROM disk drive unit.

First, the system modification disk 15 is inserted in the CD-ROM disk drive unit 2 (S10). This state is shown in FIG. 13. Thereby, access to the system modification disk 15 is started automatically or upon receipt of a reproduction indication from the operation panel 7 (S11). At the start of the access, disk format information or ID information recorded in the disk innermost circumference is checked to see if the recording format of the disk 15 conforms to the ISO9660 Format (S12). If it does not conform to the ISO9660 format, program rewriting is bypassed to proceed to ordinary audio data reproduction processing.

Upon detecting that the disk conforms to the ISO9660 format, processing of the CPU 20 branches to processing of the interface control program PGM4 and the rewriting control program PGM5 of FIG. 6. First, it is judged whether a file name "CDROM__.BIN" exists in the area of the file information 82 (S13). The symbol  denotes a wildcard, and versions are ignored in this step. If the file name exists, it is judged whether the version of the file is newer than a program version within a current flash memory 21 (S14). If so, a CD-ROM write flag in the work RAM 33 is set (S15). If a file name for the CD-ROM disk drive unit 2 does not exist or it exists but the version of an existing program is newer than the version of the file, the CD-ROM write flag is not set. For CD-RW, in the same way, it is judged whether a file name "CDRW__.BIN" exists in the area of the file information 82 (S16). If the file name exists, it is judged whether the version of the file is newer than a program version within a current flash memory 41 (S17). If so, a CD-RW write flag in the work RAM 33 is set (S18). If a file name for the CD-RW disk drive unit 4** does not exist or it exists but the version of an existing program is newer than the version of the file, the CD-RW write flag is not set.

Figure 14:
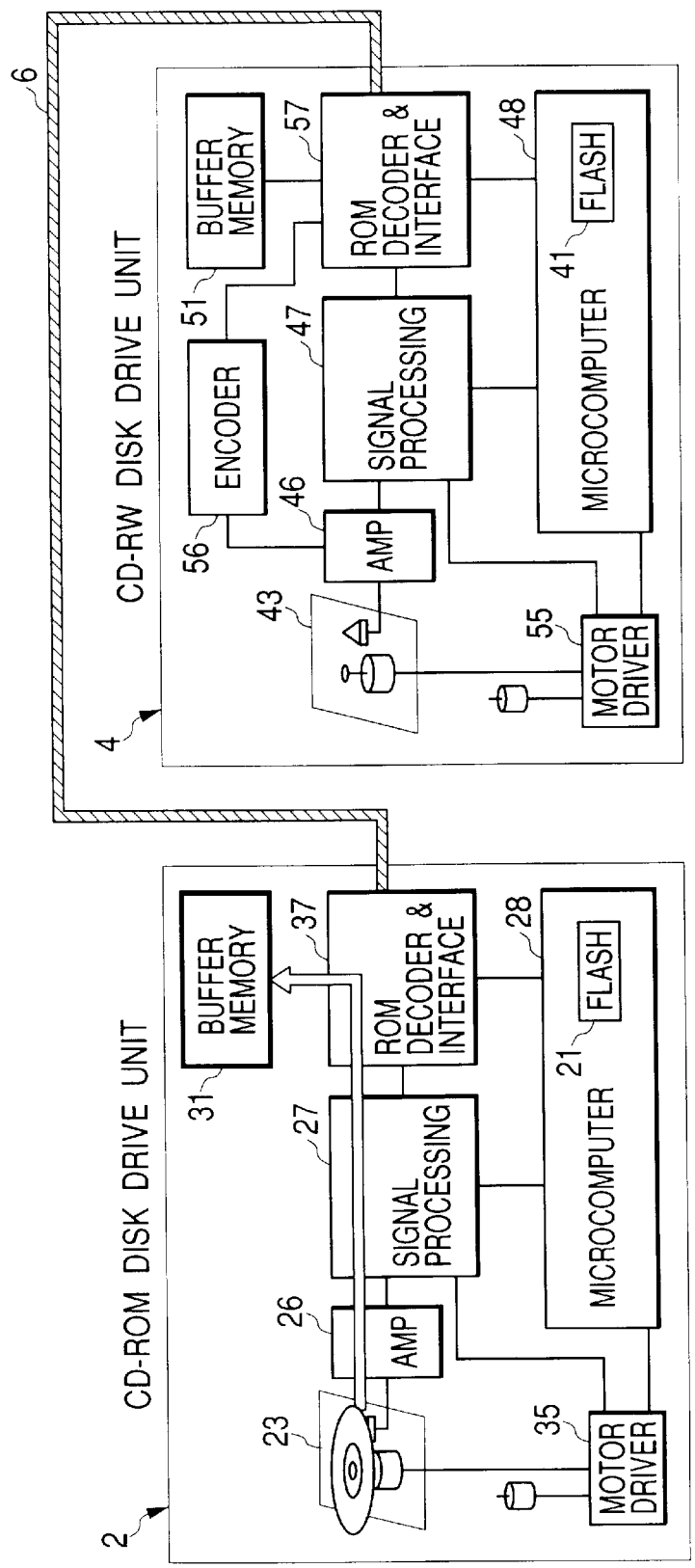
FIG. 14 is a diagram for explaining the operation when a CD-RW modification program read from a system modification disk is temporarily accumulated in a buffer RAM of a CD-ROM disk drive unit 2.

Next, it is judged whether the CD-RW write flag is set (S19), and if it is set, an instruction is made to modify the program of the CD-RW disk drive unit 4. Specifically, the start address of an area in which a modification program file (file name: CDRW__.BIN) is stored is read from the area of the file information 82 of the system modification disk 15 (S20), the pickup 22 is moved to the start address (S21), and data of the file name CDRW__.BIN is read there from and is successively stored in the buffer RAM 31 (S22). This process is shown in FIG. 14. The modification program (file name CDRW__.BIN) stored in the buffer RAM 31 is transferred to the CD-RW disk drive unit 4 from the ATAPI interface circuit 32 via the ATAPI bus 6 (S23). The transfer data is preceded by a vendor unique command that indicates the rewriting of the flash memory 41** by succeeding data.

Figure 15:
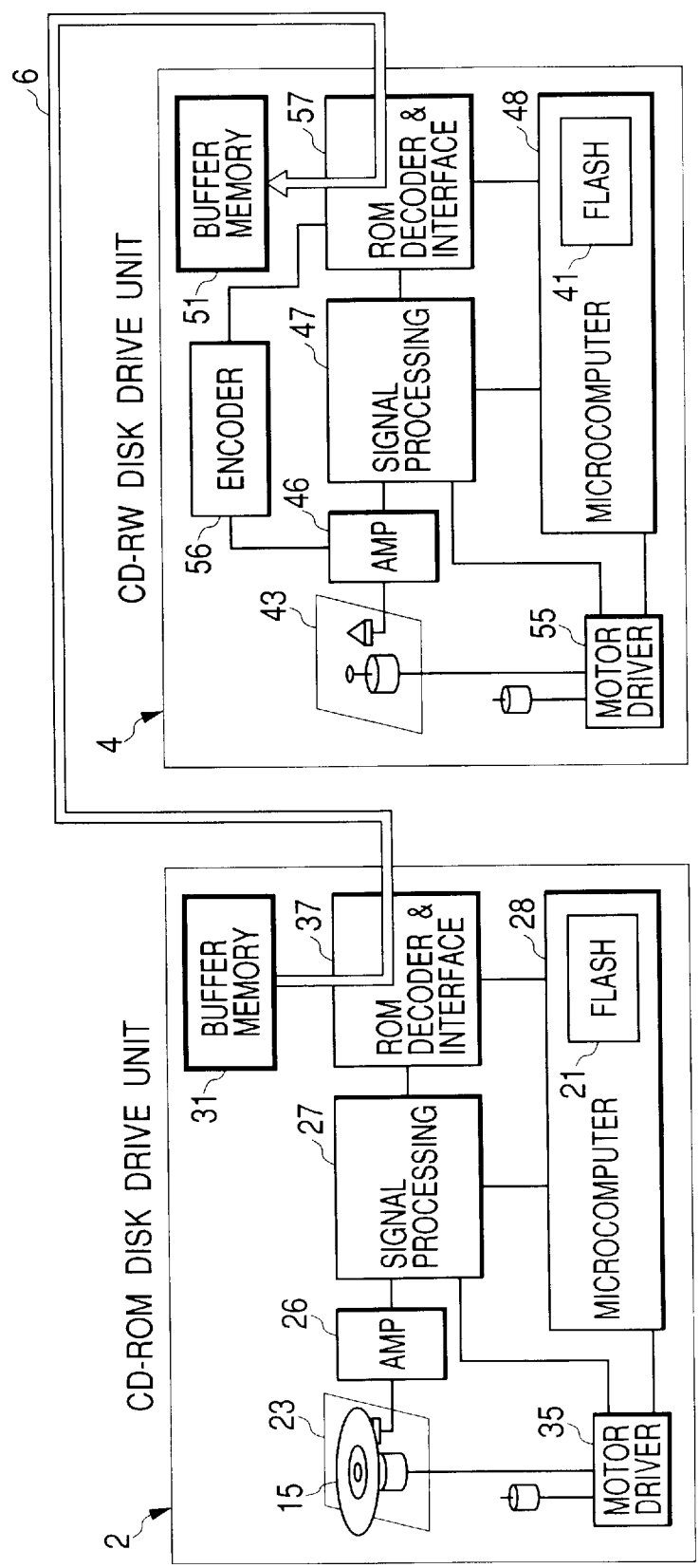
FIG. 15 is a diagram for explaining the operation when a CD-RW modification program accumulated in a buffer RAM of a CD-ROM disk drive unit is temporarily accumulated in the buffer RAM.
Figure 16:
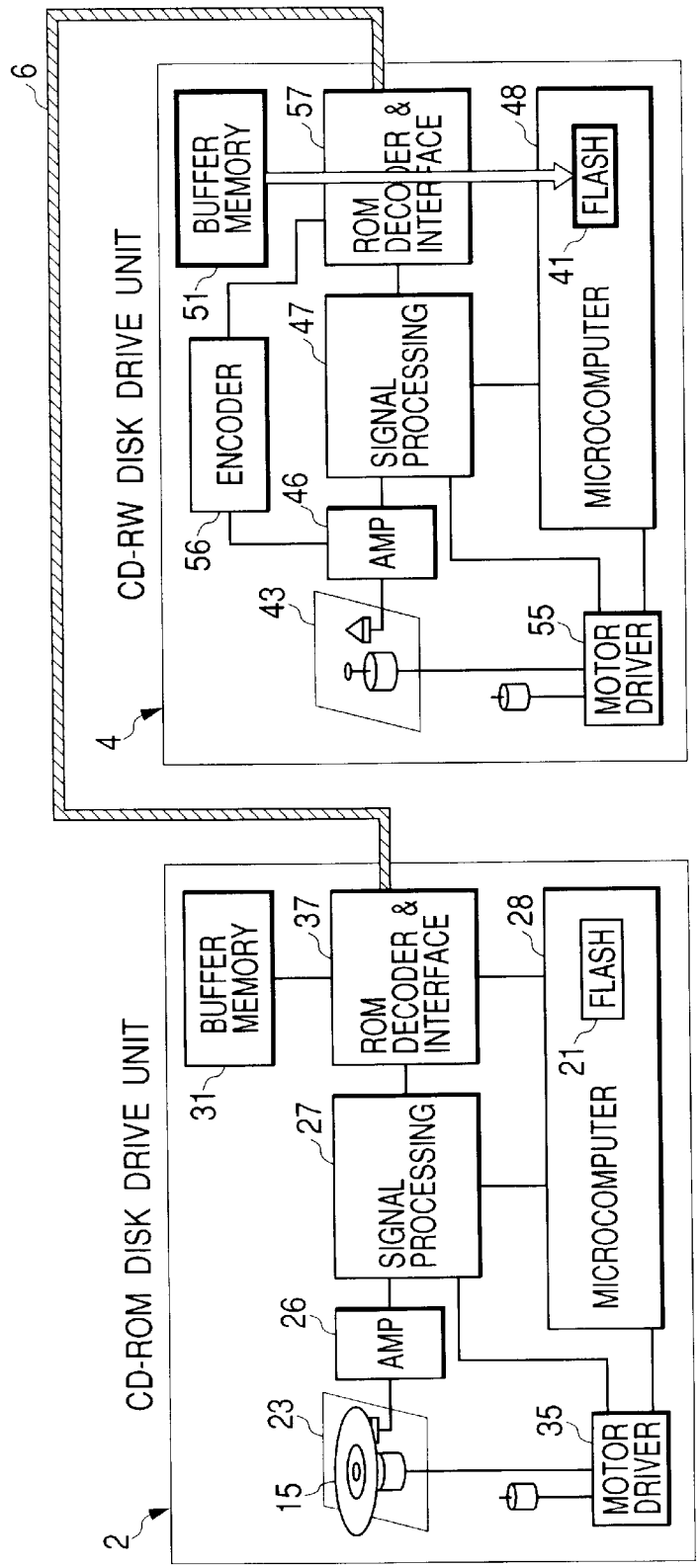
FIG. 16 is a diagram for explaining the operation when a flash memory of a CD-RW disk drive unit is rewritten to a modification program on a buffer RAM thereof.

Upon receipt of the ATAPI command, the ATAPI interface circuit 52 of the CD-RW disk drive unit 4 presents an ATAPI interrupt to the CPU 40. When the CPU 40 decodes the command and recognizes that it is a vendor unique command indicating the rewriting instruction, it proceeds to the execution of the interface control program PGM14 and the rewriting control program PGM15 as shown in FIG. 7. Thereby, the modification program (file name CDRW__.BIN) supplied via the ATAPI bus 6 is accumulated in the buffer RAM 51 and the flash memory 41 is rewritten to the modification program (file name CDRW__.BIN) on the buffer RAM 51 (S24). This process is shown in FIGS. 15 and 16.

After modification program rewriting in the CD-RW disk drive unit 4, control is transferred to modification program rewriting for the CD-ROM disk drive unit 2. The completion of modification program rewriting in the CD-RW disk drive unit 4 may be notified to the CD-ROM disk drive unit 2 from the CD-RW disk drive unit 4 through an ATAPI command, or a timer counter, not shown within a microcomputer 28, may be used to judge the completion of rewriting in the CD-RW disk drive unit 4 by determining whether a given time has elapsed.

Figure 17:
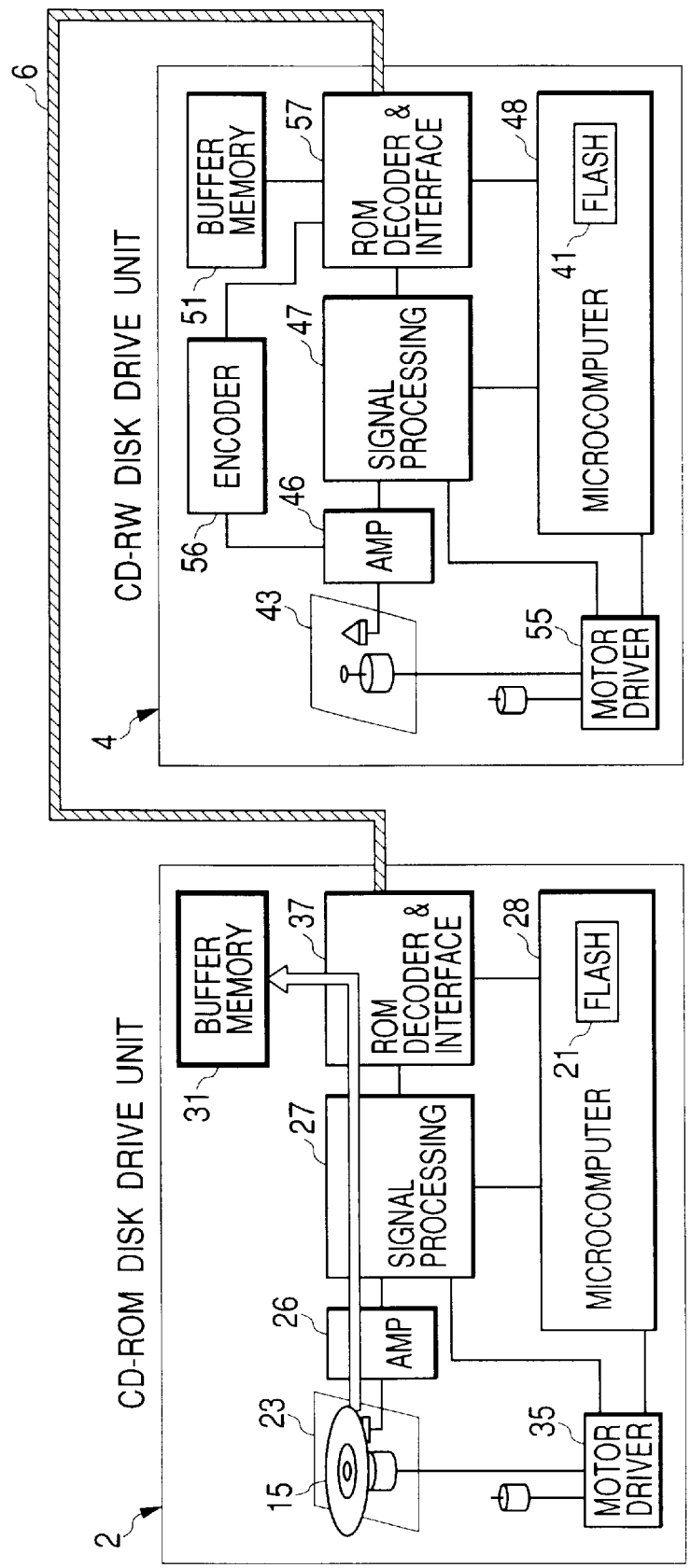
FIG. 17 is a diagram for explaining the operation when a CD-ROM modification program read from a system modification disk is temporarily accumulated in a buffer RAM of a CD-ROM disk drive unit 2.
Figure 18:
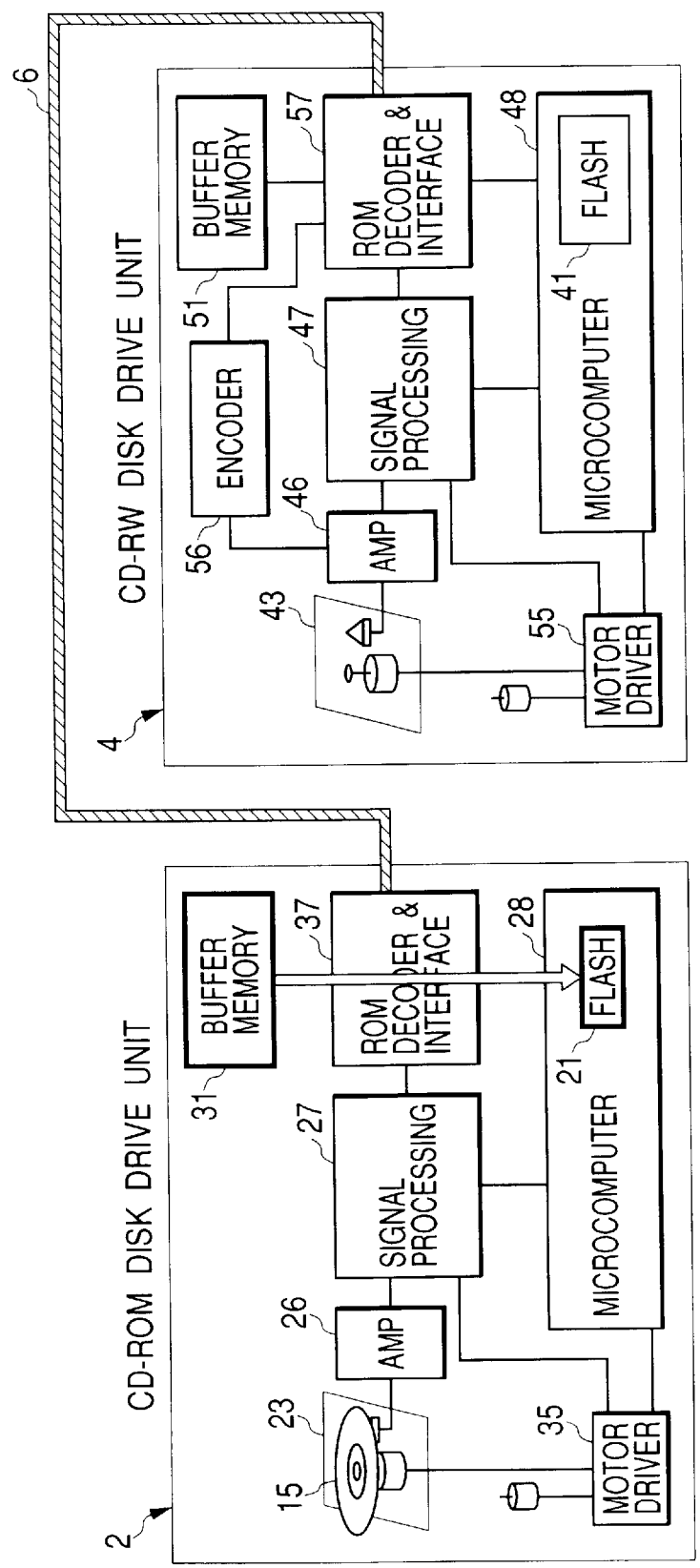
FIG. 18 is a diagram for explaining the operation when a flash memory of a CD-ROM disk drive unit is rewritten to a modification program on a buffer RAM thereof.

For modification program rewriting in the CD-ROM disk drive unit 2, it is judged whether the CD-ROM write flag is set (S25). If it is set, the start address of an area in which a modification program file (file name: CDROM__.BIN) is stored is read from the area of the file information 82 of the system modification disk 15 (S26), the pickup 22 is moved to the start address (S27), and data of the file name CDROM__.BIN is read therefrom and is successively stored in the buffer RAM 31 (S28). This process is shown in FIG. 17. The application program of the flash memory 21 is rewritten to the modification program (file name: CDROM__.BIN) stored in the buffer RAM 31 (S29). This process is shown in FIG. 18**.

According to the above described modification program rewriting, if the system modification disk 15 is reproduced in the CD-ROM disk drive unit 2, since program information can be transferred to a different disk drive unit 4, without having to remount an information recording medium in which new control programs are recorded in the respective disk drive units 2 and 4 to individually perform program rewriting, a reproduction control program or the like in each of the plural disk drive units 2 and 4 can be subjected to bug corrections and upgraded without using a host device. Therefore, updating of an access control program and other programs and function extensions by end users immediately before shipment of a product can be achieved with simple operations.

The CD-ROM disk drive unit 2 to read the system modification disk 15 performs program rewriting after program rewriting has been performed in another disk drive unit 4. In this way, if program rewriting is performed last in the CD-ROM disk drive unit 2 that accesses the system modification disk 15, rewriting can be retried however often failures occurred previously, providing safety and reliability for the program rewriting operation. It can be prevented the situation in which access control for the system modification disk 15 is disabled due to power failure, data errors, or other faults occurring in the course of program rewriting.

The storage area of the application program PGM1 (PGM11) can be rewritten aside from the storage areas of the rewriting control program PGM5 (PGM15) and the interface control program PGM4 (PGM14). Therefore, even if a failure occurs in the course of rewriting the application program PGM1 (PGM11) by use of the system modification disk 15, since the rewriting control program and the interface control program remain intact, the access control program or other programs can be again written to the flash memory 21 (41) from the buffer RAM 31 (61) for resumption, providing safety, reliability, or efficiency for the program rewriting operation.

The invention made by the present inventor has been concretely described above, based on preferred embodiments. It goes without saying that the present invention is not limited to the embodiments and various modifications and improvements may be implemented without departing from the spirit of the invention.

For example, a CPU and a flash memory may not be formed on a one-chip microcomputer but on different chips. Electrically programmable nonvolatile memories are not limited to flash memories, and may be dielectric memories or nonvolatile memories of multi-storage configuration having MONOS or MNOS structure. Although an information recording/reproducing device relating to audio and video reproduction is described above as one example, the present invention is also applicable to an information recording/reproducing device relating to video reproduction or audio and video reproduction. Therefore, recording media are not limited to CD-ROM, CD-RW, and CD-R, and the present invention is also applicable to apparatuses employing DVD, DVD-RW, DVD-RAM, MD, MO, or other media. This is also true for the types of recording media providing modification programs for plural disk drive units. Interface buses for connecting plural disk drive units are not limited to ATAPI and may be SCSI or other interfaces. An information recording/reproducing device may comprise three or more disk drive units.

Recording media relating to the present invention may be used in conventional information recording/reproducing devices incorporating double disk drive units. In short, one system modification disk is sequentially remounted in the respective disk drive units to perform program rewriting.

Effects obtained by typical ones of inventions disclosed by this application are described briefly.

Specifically, without having to remount an information recording medium in which new control programs are recorded in respective drives to individually perform program rewriting, a reproduction control program or the like in each of the plural disk drive units can be subjected to bug corrections and upgraded without using a host device.

When a reproduction control program or the like in each of the plural disk drive units is subjected to bug corrections and upgraded without using a host device, there can be provided a computer-readable recording medium in which new control programs are recorded and which need not be provided for each of the disk drive units.

What is claimed is:

1. An information recording/reproducing device, including:
    plural disk drive units in each of which a CPU executes a program stored in an electrically programmable nonvolatile memory to enable access to an information recording medium; and
    an interface bus for connecting the plural disk drive units, wherein:
    one disk drive unit uses predetermined recording information of a mounted information recording medium to rewrite a program stored in a nonvolatile memory of the one disk drive unit, and transfers a program to an other disk drive unit to instruct program rewriting; and
    the other disk drive unit rewrites a program stored in a nonvolatile memory thereof, according to the rewriting instruction from the one disk drive unit.

2. The information recording/reproducing device according to claim 1, wherein, when program rewriting is performed in the one and other disk drive units, the one disk drive unit performs program rewriting after program rewriting has been performed in the other disk drive unit.

3. The information recording/reproducing device according to claim 1, wherein the one disk drive unit has one buffer RAM for temporarily holding a rewriting program read from the information recording medium, and the other disk drive unit has an other buffer RAM for temporarily holding a rewriting program supplied from the one disk drive unit.

4. The information recording/reproducing device according to claim 3, wherein:
    the one disk drive unit has a storage area of an interface control program and a storage area of a rewriting control program wherein the interface control program stores a program for the one disk drive unit stored in the mounted information recording medium in the one buffer RAM of the one disk drive unit, and transfers a program for an other disk drive unit stored in the mounted information recording medium to the other disk drive unit to instruct writing to the other buffer RAM, while the rewriting control program rewrites a program held in a nonvolatile memory of the one disk drive unit to the program held in the one buffer RAM; and
    the other disk drive unit has a storage area of an interface control program and a storage area of a rewriting control program wherein the interface control program, in response to the instruction to write to the other buffer RAM given from the one disk drive unit, stores the program from the one disk drive unit in the other buffer RAM, while the rewriting control program rewrites a program held in a nonvolatile memory of the other disk drive unit to the program held in the other buffer RAM.

5. The information recording/reproducing device according to claim 4, wherein the nonvolatile memory of each of the one disk drive unit and the other disk drive unit includes the storage area of the rewriting control program, and the storage area of the interface control program.

6. The information recording/reproducing device according to claim 5, wherein, in the nonvolatile memory of the one disk drive unit and the other disk drive unit, the storage areas of the rewriting control program and the interface control program can be rewritten mutually independently of storage areas of other programs.

7. The information recording/reproducing device according to claim 1, further having a reproducing circuit that inputs and can reproduce digital data read from an information recording medium mounted in the respective disk drive units, wherein at least one of the disk drive units inputs digital data read from an information recording medium mounted in another disk drive unit over the interface bus and can write it to an information recording medium mounted in the one disk drive unit.

8. The information recording/reproducing device according to claim 1, further having an audio circuit that inputs digital audio data read from an information recording medium mounted in the respective disk drive units and can reproduce it to a sound signal, wherein at least one of the disk drive units inputs digital audio data read from an information recording medium mounted in another disk drive unit over the interface bus and can write it to an information recording medium mounted in the one disk drive unit.

9. The information recording/reproducing device according to claim 1, wherein the CPU and the nonvolatile memory are included in a microcomputer formed on one semiconductor chip.

10. A computer-readable recording medium in which a first access control program executed by a first CPU for instructing a first disk drive unit to access an information recording medium, a second access control program executed by a second CPU for instructing a second disk drive unit to access an information recording medium, and information for identifying the first access control program and the second access control program are recorded so as to be accessible in one of a CD-ROM disk drive unit and a CD-RW disk drive unit as the first disk drive unit and the second disk drive unit.

11. A computer-readable CD-ROM medium in which a first access control program for instructing a CD-ROM disk drive unit having a CPU to access CD-ROM media, a second access control program for instructing a CD-RW disk drive unit having a CPU to access CD-RW media, and file identification information of the first access control program and the second access control program are recorded so as to be accessible in the CD-ROM disk drive unit or the CD-RW disk drive unit.

* * * * *